United States Patent [19]

Hsieh et al.

[11] 4,258,375
[45] Mar. 24, 1981

[54] $GA_xIN_{1-x}AS_yP_{1-y}$/INP AVALANCHE PHOTODIODE AND METHOD FOR ITS FABRICATION

[75] Inventors: Jaw J. Hsieh, Burlington; Charles E. Hurwitz, Lexington, both of Mass.

[73] Assignee: Massachusetts Institute of Technology, Cambridge, Mass.

[21] Appl. No.: 28,319

[22] Filed: Apr. 9, 1979

[51] Int. Cl.$^3$ .......................................... H01L 29/161
[52] U.S. Cl. ........................................ 357/16; 357/13; 357/30; 357/52
[58] Field of Search ................... 357/30, 13, 17, 61, 357/52, 16

[56] References Cited

U.S. PATENT DOCUMENTS

| | | | |
|---|---|---|---|
| 3,622,844 | 11/1971 | Barelli | 317/234 |
| 3,821,777 | 6/1974 | James | 357/39 |
| 3,982,261 | 9/1976 | Antypar | 357/16 |

OTHER PUBLICATIONS

Hurwitz et al., "Topical Meetin on Integrated and Guided Wave Optics" Digest of Technical Papers, Jan. 10-18, 1977, pp. mc1-1,2, and 3.
Hurwitz et al., "GaInAsP/InP Avalanche Photodiode", full paper presented at Topical Meeting, Jan. 1977, Salt Lake City, UT.
Hurwitz et al., *Appl. Phys. Lett.*, 32(8), Apr. 15, 1978, pp. 487-489.
Ito et al., *Electronics Letters*, 14, pp. 418-419, Jul. 6, 1978.
Lee et al., *IEEE J. Quantum Electronics*, vol. qe-15, No. 1, Jan. 1979, pp. 30-35.
Takanashi, et al., *Jap. J. Appl. Phys.*, 17(1978), No. 11, pp. 2065-2066.
Weider et al., *Appl. Phys. Lett.*, 31, No. 7, Oct. 1, 1977, pp. 468-470.
Clawson et al., *Appl. Phys. Letts.*, 32(9), May 1, 1978, pp. 549-551.

*Primary Examiner*—Martin H. Edlow
*Attorney, Agent, or Firm*—Arthur A. Smith, Jr.; David E. Brook

[57] ABSTRACT

An improved avalanche photodiode having an active layer of $Ga_xIn_{1-x}As_yP_{1-y}$ containing a p-n junction and a window layer grown epitaxially to an n+ substrate is disclosed herein, as well as methods for its fabrication.

12 Claims, 2 Drawing Figures

$Ga_xIn_{1-x}As_yP_{1-y}$/INP AVALANCHE PHOTODIODE AND METHOD FOR ITS FABRICATION

GOVERNMENT SUPPORT

Work relating to this invention was supported by the United States Air Force.

TECHNICAL FIELD

This invention is in the field of solid state devices and more particularly relates to avalanche photodiodes formed from GaInAsP.

BACKGROUND ART

Double-heterostructure diode lasers based upon epitaxial layers of GaInAsP grown upon InP substrates have been disclosed. See Bogatov, A. P., Dolginov, L. M., Druzhinina, L. V., Eliseev, P. G., Sverdlov, B. N., and Schevchenko, E. G., *Sov. J. Quantum Electron.*, 4, 1281 (1975); Hsieh, J. J., *Appl. Phys. Lett.*, 28, 283 (1976); and Pearsall, T. P., Miller, B. I., Capik, R. J. and Bachman, K. J., *Appl. Phys. Lett.*, 28, 499 (1976). The emission wavelength of such lasers can be controlled within the range of about 0.95–1.70 μm at room temperature without significantly detracting from good lattice-matching by simply changing the composition of the quaternary solid solution of GaInAsP. Since this range includes 1.1–1.3 μm, the region currently thought to be optimum for optical communication systems utilizing fused silica fibers, these lasers are prime candidates for use in optical communications.

In order for such lasers to be utilized in optical communication systems, nevertheless, detector systems capable of operating within this wavelength range will also be necessary. In particular, it would be advantageous to have an avalanche photodiode capable of operating within this wavelength range.

Photodiodes fabricated from silicon and germanium have been known for many years. Silicon, however, has a low quantum efficiency for wavelengths longer than 1.1 μm. Germanium, on the other hand, has nearly equal ionization coefficients for electrons and holes, which leads to a large excess noise factor and inherently lower speed of response. Germanium also has a smaller than optimum bandgap for 1.3 μm peak wavelength response which results in a large dark current unless cooled below room temperature.

More recently, avalanche photodiodes have been fabricated from materials including GaInAs and GaAsSb epitaxially grown on GaAs substrates. In these systems, severe lattice-mismatches between the epitaxial layer and the GaAs substrate have necessitated intermediate matching layers of other compositions. This has necessitated complicated and delicate structures which require elaborate fabrication procedures. Additionally, yields of reasonably performing devices have been very low. Furthermore, most of the work done in regard to detectors with these systems have resulted in detectors which respond only out to wavelengths of about 1.1 μm. The lattice-mismatch problems become much more severe for compositions capable of responding to longer wavelengths.

Avalanche photodiodes have also been fabricated from the ternary alloy GaInAs grown lattice-matched to InP substrates. See Pearsall, T. P. and Hopson, Jr., R. W., *J. Electron. Mater.*, 7, 133 (1978). Although avalanche gain was noted at 1.2 μm, the peak response with this system was fixed at about 1.6 μm and could not to be chosen to optically respond to any particular desired wavelength. Further, the single heterostructure design led to the loss of photogenerated carriers by surface recombination, leading to reduced quantum efficiency.

Even more recently, avalanche photodiodes have been fabricated employing the quaternary GaInAsP on InP substrates. See Hurwitz, C. E. and Hsieh, J. J., "Topical Meeting on Integrated and Guidewave Optics", Digest of Technical Papers presented Jan. 16–18, 1977, pages MCl-1, 2 and 3 (1978).

DISCLOSURE OF THE INVENTION

This invention relates to improved avalanche photodiodes based upon quaternary layers of $Ga_xIn_{1-x}As_yP_{1-y}$. The avalanche photodiodes of this invention are formed from an n+ InP substrate upon which an active layer of $Ga_xIn_{1-x}As_yP_{1-y}$ is epitaxially deposited to achieve a good lattice match followed by deposition of a top window layer. A p-n junction is formed and ohmic contacts are applied to the front and back surfaces of the device. The p-n junction contained within the $Ga_xIn_{1-x}As_yP_{1-y}$ active layer can be formed by diffusing a p-dopant, such as zinc atoms, into the window and $Ga_xIn_{1-x}As_yP_{1-y}$ layers from the top of the device.

This structure has significant advantages over avalanche photodiodes based upon $Ga_xIn_{1-x}As_yP_{1-y}$ active layers deposited on p substrates. For example, an avalanche photodiode formed on an n-type substrate should have less noise than the corresponding photodiode formed on a p-type substrate under top illumination. This is true because the electron ionization rate of $Ga_xIn_{1-x}As_yP_{1-y}$ is higher than that of holes. It is possible, of course, to detect illumination from the substrate side of a photodiode grown on a p-type substrate to thereby obtain a similar noise value corresponding to that obtained with a photodiode grown on a n-type substrate and sensed from the window layer side, but this necessitates more complicated procedures in fabricating such a photodiode and the device is mechanically weaker when the device is mounted on a package from its window layer side, particularly when the device has a mesa structure. In the present invention, the improved device permits diffusion of p-type dopants to be performed from the mesa window and also allows the p-type layers to be formed by other techniques such as ion implantation. The capability to diffuse p-type dopants from the top window layer is important to the ultimate device performance because it allows control of p-dopant concentration as well as diffusion depth in a much more accurate manner.

BEST MODE OF CARRYING OUT THE INVENTION

The invention can be further described with particular reference to the Figures.

Figure 1:
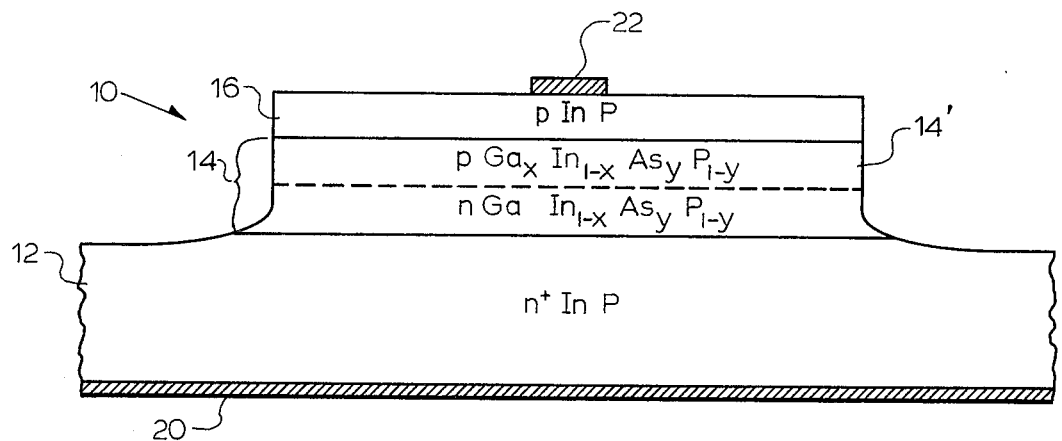
FIG. 1 is a cross-sectional view of an avalanche photodiode according to this invention; and, FIG. 2 is a cross-sectional view of an alternative embodiment of an avalanche photodiode according to this invention in which a guard ring structure has been added.

An avalanche photodiode 10 according to this invention is illustrated in FIG. 1. Avalanche photodiode 10 is formed by starting with n+ —InP substrate 12. Substrate 12 preferably has a substantially (111)B or (100) orientation, although exact orientation is not critical. Substrate 12 might comprise, for example, a Czochralaski-grown crystal of InP doped with Sn or other n-type dopants to a carrier concentration of about $10^{18}$ carrier/cm$^3$. The substrate surface can be lapped with 2 μm grit of alumina, chemi-mechanically polished with Br—CH$_3$OH, and then free-etched with Br—CH$_3$OH to remove an additional 10 μm of material. It is possible, of course, to grow active layers of $Ga_xIn_{1-x}As_yP_{1-y}$ on InP substrates having other orientations, and with other techniques of surface preparation.

Subsequently, n-type $Ga_xIn_{1-x}As_yP_{1-y}$ layer 14 is grown on InP substrate 12 using a technique such as super-cooled liquid phase epitaxy (LPE). A thorough discussion of the growth of liquid phase epitaxy layers by the super-cooling, step-cooling, equilibrium-cooling and 2-phase solution techniques is presented in Hsieh, J. J., "Thickness and Surface Morphology of GaAs LEP Layers Grown by Super-Cooling, Step-Cooling, Equilibrium-Cooling and 2-phase Solution Techniques," *J. Cryst. Growth*, 27, 49–61 (1974). LPE techniques from super-cooled solutions are also described for the growth of $Ga_xIn_{1-x}As_yP_{1-y}$ layers on InP substrates for the purpose of fabricating double-heterostructure lasers in copending application Ser. No. 816,402, filed July 18, 1977.

Although super-cooling liquid-phase epitaxy is the preferred method, other growth techniques, including step-cooling, equilibrium-cooling and 2-phase solution techniques are also suitable.

The thickness of active $Ga_xIn_{1-x}As\,P_{1-y}$ layer 14 can vary and a typical range would be 2–5 μm. Window layer 16 is epitaxially deposited on $Ga_xIn_{1-x}As_yP_{1-y}$ layer 14. Window layer 16 can be indium phosphide or a quaternary having the formula $Ga_{x'}In_{1-x'}As_{y'}P_{1-y'}$ wherein $0 \leq x' \leq x$ and $0 \leq y' \leq y$. Window layer 16 has a bandgap which is equal to or higher than the bandgap of $Ga_xIn_{1-x}As_yP_{1-y}$ layer 14. Window layer 16 can be either n or p-type and a typical thickness for window layer 16 would be about one μm.

Subsequently, p-dopant can be diffused into window layer 16 and n-type $Ga_xIn_{1-x}As_yP_{1-y}$ layer 14 to produce p-type $Ga_xIn_{1-x}As_yP_{1-y}$ layer 14'. This can be done, for example, by sealing the device in an ampoule containing a source of zinc atoms, such as ZnP$_2$. A typical diffusion would be carried out at 500° C. for about an hour. Such diffusion typically results in the formation of a p-n homojunction located a distance of up to about 1.5 μm from the interface between window layer 16 and p-type layer 14'. Alternately, p-type layer 14' could be formed by ion implantation, or other suitable techniques. In some cases, it would even be suitable to omit diffusion of p-type dopants or ion implantation and simply to rely upon the heterojunction formed between a p-type window layer 16 and n-type active layer 14.

Ohmic contacts are then applied to both sides of the device. Ohmic contact 20 can be formed by evaporating a layer of Au—Sn whereas ohmic contact 22 can be formed by evaporating a thin layer of Au—Mg and then defining a small area using standard photo-lithographic techniques, each followed by alloying at 400° C. in a nitrogen atmosphere. Following application of ohmic contacts 20 and 22, the device is etched using a solution such as 1% Br in methanol to provide the mesa structure illustrated in FIG. 1. The purpose of forming the desired mesa structure is to minimize or prevent edge breakdown of the devices, as is known in the art.

Figure 2:
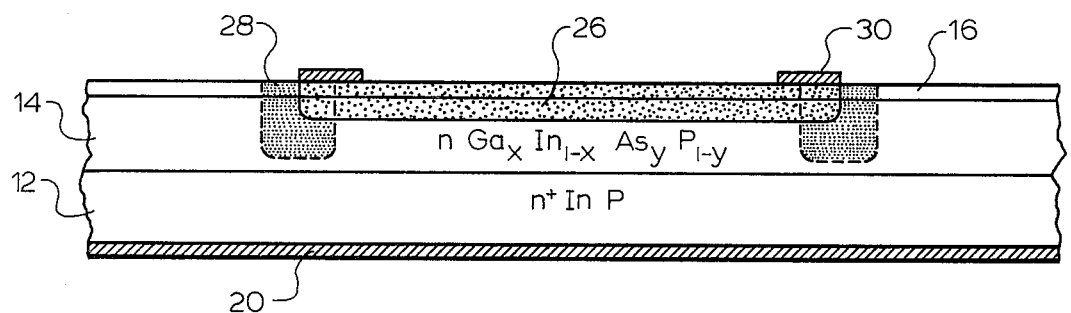

Other methods of preventing edge breakdown can be employed, of course. One such method is illustrated in the device shown in FIG. 2 in which the diffused or implanted p layer 26 is surrounded by a guard ring structure 28. Guard ring structure 28 is formed from a p region which can be provided also by diffusion or ion implantation. Suitable guard ring structures are known in the art. See, for example, Anderson, L. K. and Mc-Murtry, B. J., "High-speed Photodetectors", *Proceedings of the IEEE*, 54, No. 10, Oct. 1966. In this device, the top ohmic contacts 30 are not deposited continuously across the top surface. Ohmic contacts 30 can be formed, however, from the same material as ohmic contact 22 in FIG. 1. Other similar layers and materials in FIG. 2 are referred to by the same numerals as were previously employed in describing FIG. 1.

In growing the active layer of $Ga_xIn_{1-x}As_yP_{1-y}$ upon the n+ InP substrate, it is preferred to employ a melt back technique and/or the use of a thin buffer layer of InP. The former is described by V. Wrick et al. at *Electr. Lettrs*, 12, pp 394–5 (1976), whereas the latter is described in copending application Ser. No. 816,402, filed July 18, 1977.

INDUSTRIAL APPLICABILITY

This invention has industrial applicability in the fabrication of avalanche photodiode detectors which are particularly suitable in the 1.0–1.6 wavelength region.

EQUIVALENTS

Those skilled in the art will recognize, or will be able to ascertain using no more than routine experimentation, many equivalents to the specific embodiments of the invention described herein. Such equivalents are intended to be encompassed by the following claims.

We claim:
1. An avalanche photodiode, comprising:
   a. an n+ InP substrate;
   b. an active layer of $Ga_xIn_{1-x}As_yP_{1-y}$ lattice-matched to said substrate and having a p-n junction sufficient to produce an avalanche effect in said photodiode;
   c. a window layer lattice-matched to said substrate, said window layer having a bandgap equal to or higher than the bandgap of said active layer and being formed from InP or a quaternary having the formula $Ga_{x'}In_{1-x'}As_{y'}P_{1-y'}$ wherein $0 \leq x' \leq x$ and $0 \leq y' \leq y$; and,
   d. ohmic contacts to said avalanche photodiode.

2. An avalanche photodiode of claim 1 wherein said window layer is formed from $Ga_{x'}In_{1-x'}As_{y'}P_{1-y}$, wherein $0 \leq x' \leq x$ and $0 \leq y' \leq y$.

3. An avalanche photodiode of claim 2 wherein said substrate has a substantially (111)B of (100) orientation.

4. An avalanche photodiode of claim 3 wherein said active layer of $Ga_xIn_{1-x}As_yP_{1-y}$ contains a p-n homojunction.

5. The method of fabricating an avalanche photodiode, comprising:
   a. depositing an epitaxial lattice-matched active layer of n-type $Ga_xIn_{1-x}As_yP_{1-y}$ on an n+-type InP substrate;
   b. depositing an epitaxial lattice-matched window layer of $Ga_{x'}In_{1-x'}As_{y'}P_{1-y'}$, wherein $0 \leq x' \leq x$ and $0 \leq y' \leq y$, over said $Ga_xIn_{1-x}As_yP_{1-y}$ layer;

c. diffusing or implanting p-type dopant into said window layer of $Ga_{x'}In_{1-x'}As_{y'}P_{1-y'}$ and said active layer of $Ga_xIn_{1-x}As_yP_{1-y}$ to form a p-n junction therein; and, d. applying ohmic contacts to said substrate and said window layer of said avalanche photodiode.

6. The method of claim 5 wherein said p-n junction is 0 to about 1.5 μm from the interface between said active and said window layers.

7. A method of claim 6 wherein said avalanche photodiode is etched to provide a mesa structure.

8. A method of claim 6 wherein a guard ring structure is formed in the n-type $Ga_xIn_{1-x}As_yP_{1-y}$ active layer by diffusing therein p-type dopant.

9. A method of claim 6 wherein a guard ring structure is formed in said n-type $Ga_xIn_{1-x}As_yP_{1-y}$ active layer by implanting therein p-type ions.

10. A method of claim 6 wherein the surface of said $n^+$-*type InP substrate is melted back prior to deposition of said layer of n-type $Ga_xIn_{1-x}As_yP_{1-y}$.*

11. A method of claim 6 wherein a buffer layer of InP is deposited upon said $n^+$-type InP substrate prior to depositing said n-type $Ga_xIn_{1-x}As_yP_{1-y}$ active layer thereon.

12. A method of claim 6 wherein said p-type dopant comprises zinc atoms.

* * * * *